US008358680B2

(12) United States Patent
Morris et al.

(10) Patent No.: US 8,358,680 B2
(45) Date of Patent: Jan. 22, 2013

(54) REDUCING POWER LEVELS ASSOCIATED WITH TWO OR MORE SIGNALS USING PEAK REDUCTION DISTORTION THAT IS DERIVED FROM A COMBINED SIGNAL

(75) Inventors: Bradley John Morris, Ottawa (CA); Arthur Thomas Gerald Fuller, Carp (CA)

(73) Assignee: Apple Inc., Cupertino, CA (US)

( * ) Notice: Subject to any disclaimer, the term of this patent is extended or adjusted under 35 U.S.C. 154(b) by 654 days.

(21) Appl. No.: 12/343,221

(22) Filed: Dec. 23, 2008

(65) Prior Publication Data
US 2010/0158083 A1   Jun. 24, 2010

(51) Int. Cl.
*H04K 1/10*   (2006.01)
*H04L 27/28*   (2006.01)
(52) U.S. Cl. .................................... 375/219; 375/260
(58) Field of Classification Search ............. 375/296, 375/297, 299, 260; 455/126, 296
See application file for complete search history.

(56) References Cited

U.S. PATENT DOCUMENTS

| 6,294,956 B1* | 9/2001 | Ghanadan et al. ......... 330/124 R |
| 2002/0021764 A1* | 2/2002 | Posti ........................... 375/296 |
| 2007/0129026 A1 | 6/2007 | Marsili |
| 2008/0049868 A1* | 2/2008 | Brobston ..................... 375/297 |

FOREIGN PATENT DOCUMENTS

| CA | 2 317 901 A1 | 3/2001 |
| FR | 2 746 563 A1 | 9/1997 |
| WO | 0039920 A1 | 7/2000 |

OTHER PUBLICATIONS

Muta, O., et al. "A Peak Power Reduction Scheme with Adaptive Transmit Power Control for Multi-Carrier Transmission," Vehicular Technology Conference, 1999, IEEE 49th vol. 3, p. 2144-2148.
International Search Report for PCT/IB2009/007632, mailed Apr. 27, 2010.

* cited by examiner

*Primary Examiner* — David C. Payne
*Assistant Examiner* — Wednel Cadeau
(74) *Attorney, Agent, or Firm* — Meyertons, Hood, Kivlin, Kowert & Goetzel, P.C.

(57) ABSTRACT

The present invention provides a technique for reducing power levels associated with two or more input signals using peak reduction distortion that is derived from a combined signal, which represents a combination of the input signals.

25 Claims, 6 Drawing Sheets

A = $I_1$ or $I_2$ WITHOUT PPR
B = $I_1$ WITH PPR OR $I_2$ WITH PPR
C = COMBINATION OF $I_1$ W/ PPR AND $I_2$ W/ PPR
D = $I_1'$ or $I_2'$
E = $I_C$

REDUCING POWER LEVELS ASSOCIATED WITH TWO OR MORE SIGNALS USING PEAK REDUCTION DISTORTION THAT IS DERIVED FROM A COMBINED SIGNAL

FIELD OF THE DISCLOSURE

The present invention relates to reducing power levels associated with two or more signals using peak reduction distortion that is derived from a combined signal.

BACKGROUND

Power amplifiers are used in communication systems to increase the power of a signal for transmission across a desired communication medium. It is generally desirable to maintain the distortion associated with amplification relatively low, and a common cause of distortion is clipping. An output signal of the amplifier is clipped when peaks of an input signal exceed a threshold at which a corresponding output signal with a desired gain cannot be produced. Instead of the output signal faithfully tracking the input signal, the output signal is effectively suppressed, or clipped, to the level of the amplifier's maximum capabilities at points where clipping occurs. When clipping occurs, the output signal is distorted in an uncontrolled manner, which leads to a loss of information represented by the signal peaks and causes unwanted noise in the transmission spectrum.

Power amplifiers and surrounding circuitry are generally designed with clipping in mind. In particular, power amplifiers are designed to avoid clipping for most, if not all, possible signals. This often requires power amplifiers to be designed to handle the higher peaks of a given signal even when such peaks infrequently occur. The higher the signal peaks, the larger the amplifier must be. Increasing the size of an amplifier usually increases costs of the amplifier as well as reduces amplifier efficiency, which leads to greater power consumption and shorter battery lives for fixed and portable communication systems.

Peak-to-average power ratio (PAPR) has an impact on amplifier efficiency, and in particular is a measure of the instantaneous peak power relative to the average power being supplied by a power amplifier when amplifying a given input signal to provide an amplified output signal. More efficient amplifiers require less energy to amplify a given signal to a certain level than less efficient amplifiers. As the efficiency of an amplifier increases, the amount of energy required to amply signals decreases, thus reducing the operational power required for the communication system which is advantageous in both base station and mobile applications. Generally, a lower PAPR enables higher amplifier efficiency, whereas a higher PAPR results in lower amplifier efficiency. Accordingly, designers are constantly trying to build more efficient communication systems that result in lower PAPRs.

The PAPR for communication systems is typically a function of the input signal being amplified by the amplifier. The peak and average amplitudes of the input signal correlate to the instantaneous peak and average powers provided by the power amplifier while amplifying the input signal. As such, an input signal that has relatively high instantaneous peaks in amplitude with respect to the overall average amplitude is considered a high PAPR signal, whereas an input signal that has relatively low instantaneous peaks in amplitude with respect to the overall average amplitude is considered a low PAPR signal. The peak and average amplitudes of the input signal are often a function of how the input signal is modulated.

Typical modulation schemes employed in modern communication systems include frequency division multiple access (FDMA), including orthogonal frequency division multiple access (OFDMA); code division multiple access (CDMA); and time division multiple access (TDMA) schemes. OFDMA systems, such as the Third Generation Partnership Project's (3GPP's) Long Term Evolution (LTE) standard and the World Wide Interoperability for Microwave Access (WiMAX) standard, employ a number of independently modulated sub-carriers, which can result in high PAPRs. CDMA systems, such as the Universal Mobile Telecommunications Systems (UMTS), employ spread spectrum modulation and are also considered to have high PAPRs, similar to OFDMA systems. TDMA systems, such as Global System for Mobile Communications (GSM), employ a constant power envelope, and as such, have very low PAPRs. Enhanced Data Rates for GSM Evolution (EDGE) is non-constant envelope and generally lies between GSM and CDMA or OFDMA systems with respect to PAPR. For systems that have relatively high PAPRs, techniques have been employed to reduce the peak amplitude of the modulated input signal prior to amplification in an effort to reduce the associated PAPR, and as a result, may increase the efficiency of the power amplifier.

An exemplary PAPR reduction technique involves intentionally distorting a given input signal, which is only modulated according to a single modulation scheme, to effectively reduce those peaks that exceed a given threshold. Prior to amplification, the peaks of the input signal that exceed the given threshold are removed, or clipped, to form a clipped signal. The clipped signal is subtracted from the input signal to form a distortion signal, which is subsequently processed and applied to the entirety of the input signal to result in peak reduction. Application of the attenuated distortion signal to the input signal effectively reduces those peaks that exceed the given threshold. This and other PAPR reduction techniques have proven relatively successful when applied to signals that are only modulated according to a single modulation scheme.

In modern communication systems, diversity techniques are employed to use transmission resources more efficiently and reduce transmit power levels. Diversity techniques generally employ multiple antennas through which the same or different data may be transmitted at the same time. When two or more signals are transmitted concurrently, the signals can effectively be combined. The PAPR associated with the combined signals can significantly increase, which leads to decreased amplifier efficiency. Interestingly, the combination of signals that have been individually subjected to peak power reduction is often associated with a PAPR that is dramatically higher than that which is associated with the either of the individually peak power reduced signals. As such, even if PAPR reduction techniques are individually applied to each of the signals before the respective signals are combined, the combined input signal will still have an undesirable PAPR.

Accordingly, there is a need for an effective and efficient technique to reduce the PAPR associated with a combined signal.

SUMMARY OF THE DETAILED DESCRIPTION

The present invention provides a technique for reducing power levels associated with two or more input signals using peak reduction distortion that is derived from a combined signal, which represents one or more combinations of the input signals. Initially, the input signals are combined to form the combined signal, and based on the combined signal, peak reduction distortion is generated. The peak reduction distortion is configured such that, if applied to the entirety of the combined signal, excessive portions throughout the combined signal would be reduced. Instead of applying the peak reduction distortion directly to the combined signal, the peak reduction distortion is applied to each of the input signals to provide preconditioned signals. As such, those portions in each of the preconditioned signals that correspond to excessive portions in the combined signal are reduced by an amount related to the extent in which the excessive portions exceed a desired threshold.

Splitting circuitry is configured to receive the preconditioned signals and generate a number of split signals based on the preconditioned signals. Each split signal is a function of each of the preconditioned signals, and as such, may have components of all of the preconditioned signals. Notably, application of the peak reduction distortion that is derived from the combined signal to each of the input signals results in each of the split signals being associated with relatively lower peak-to-average power ratios (PAPRs). Each split signal is up-converted to radio frequency (RF) and amplified by power amplifiers along corresponding parallel amplification paths to provide a like number of amplified RF signals. Notably, the split signals are associated with a relatively low total peak power, and as such, the corresponding up-converted signals are also associated with a relatively low total peak power. Given the relatively low total peak power of the up-converted signals, the overall power amplification needed for the system is commensurately low. The combination of amplifiers in the parallel paths can be sized and configured to take advantage of the relatively low peak power amplification requirements and operate in a relatively efficient manner.

The amplified RF signals are provided to combining circuitry to generate RF output signals that directly correspond to each of the preconditioned input signals and represent up-converted and amplified versions of the preconditioned input signals. The splitting circuitry and the combining circuitry provide complementary signal processing functions, such that the split signals are generated from the preconditioned signals using splitting functions that are complementary to the combining functions that are used to generate the RF output signals from the amplified RF signals. The RF output signals are then presented to antennas for transmission.

Those skilled in the art will appreciate the scope of the present invention and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the invention, and together with the description serve to explain the principles of the invention.

DETAILED DESCRIPTION

The embodiments set forth below represent the necessary information to enable those skilled in the art to practice the invention and illustrate the best mode of practicing the invention. Upon reading the following description in light of the accompanying drawings, those skilled in the art will understand the concepts of the invention and will recognize applications of these concepts not particularly addressed herein. It should be understood that these concepts and applications fall within the scope of the disclosure and the accompanying claims.

Figure 1:
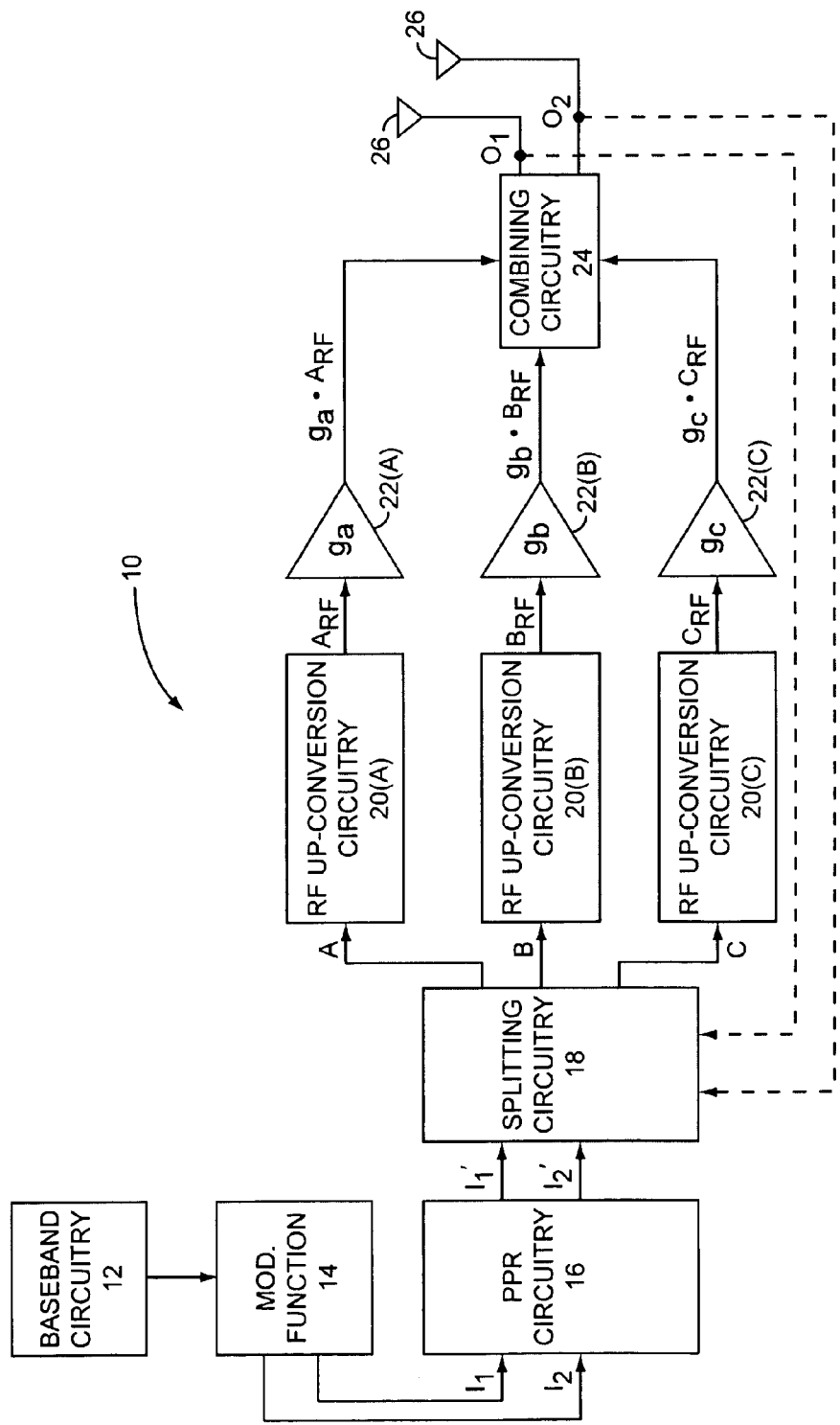
FIG. 1 is a block representation of transmit circuitry for a communication system according to one embodiment of the present invention.

With reference to FIG. 1, a transmission path for a communication device 10 is illustrated according to one embodiment of the present invention. Assume for this example that appropriate baseband circuitry 12 and a modulation function 14 are provided, wherein the baseband circuitry 12 provides data to be transmitted to the modulation function 14. The modulation function 14 is capable of modulating the data according to a desired modulation scheme and generating two or more modulated signals according to a diversity scheme, wherein the content of the different signals at any given time may be the same or different depending on the nature of diversity. For example, different data may be mapped to the different input signals at the same time or the same data may be mapped to the different signals at the same time. Although any number of input signals may be used, the following description uses two input signals, which are referenced as $I_1$ and $I_2$, to illustrate various embodiments of the invention. Although any type of modulation schemes may be provided, assume for the purposes of illustration only that the modulation function 14 will provide Orthogonal Frequency Division Modulation (OFDM) based Long Term Evolution (LTE) signals, and as such, input signals $I_1$ and $I_2$ are OFDM signals. Additional input signals $I_x$ of the same or different modulation schemes may be provided at any given time by the baseband circuitry 12 and processed according the concepts of the present invention.

In general, the present invention provides a technique for reducing the power levels associated with two or more input signals $I_1$ and $I_2$ using peak reduction distortion that is derived from a combined signal $I_C$, which represents one or more combinations of the input signals $I_1$ and $I_2$. The input signals $I_1$ and $I_2$ are combined according to an input combination function $f_{ic}(x)$ to form the combined signal $I_C$ by peak power reduction (PPR) circuitry 16. In the illustrated embodiment, the input signals $I_1$ and $I_2$ are combined by the PPR circuitry 16 by simply summing the input signals $I_1$ and $I_2$; however, either or both of the input signals $I_1$ and $I_{22}$ may be independently weighted, phase-shifted, or the like as well any combination thereof while being combined according to the input combination function $f_{ic}(x)$. For example, the different input signals $I_1$ and $I_2$ may be weighted differently using appropriate weighting factors while one or both of the input signals $I_1$ and $I_2$ is shifted in phase by a desired amount.

Figure 2A:
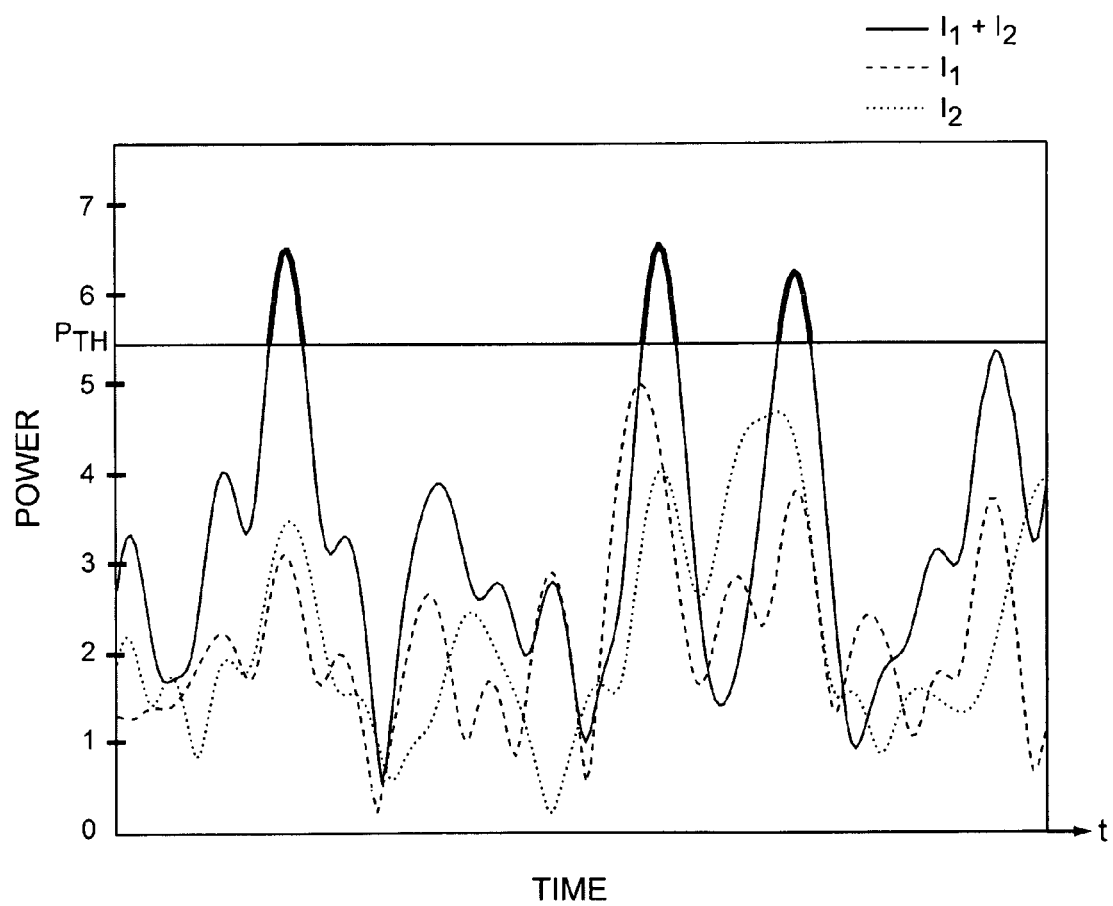
FIGS. 2A and 2B together illustrate the application of peak reduction distortion according to one embodiment of the present invention.
Figure 2B:
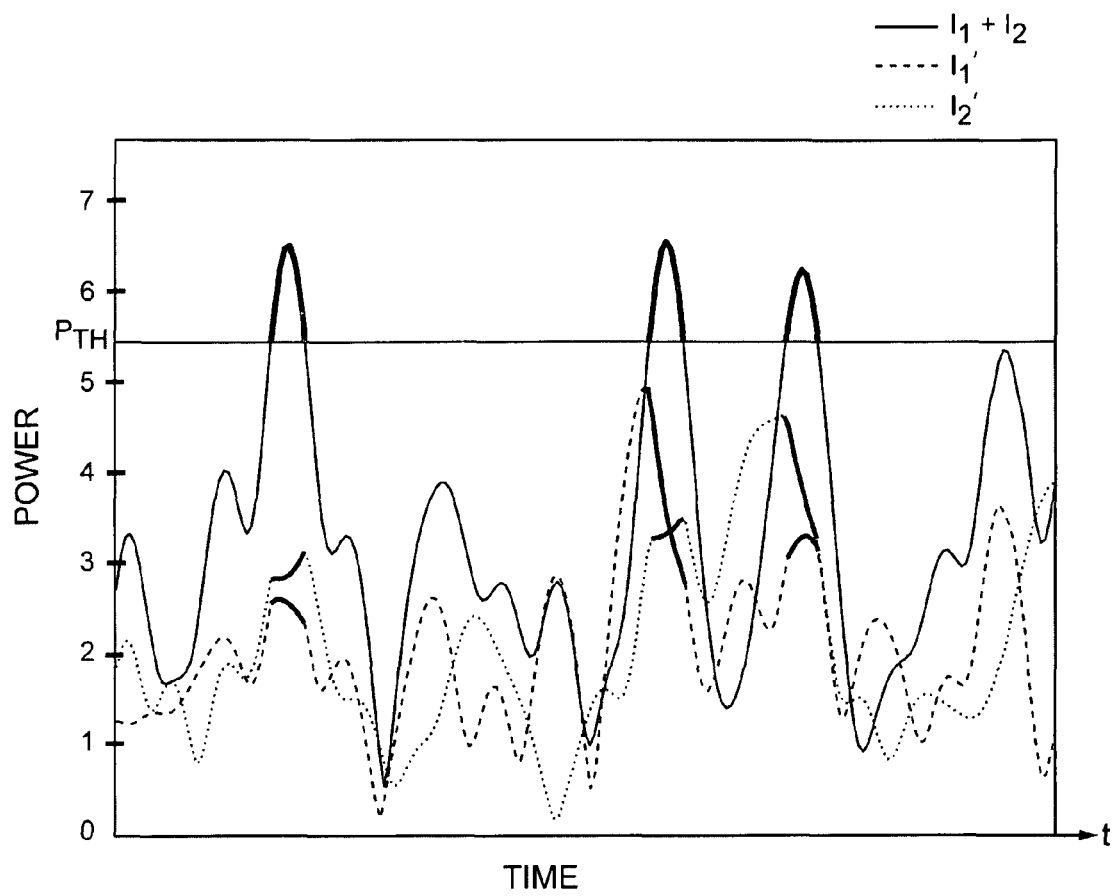

Based on the combined signal $I_C$, peak reduction distortion is generated. The peak reduction distortion is configured such that, if applied to the entirety of the combined signal $I_C$, excessive portions throughout the combined signal $I_C$ would be reduced. Instead of applying the peak reduction distortion directly to the combined signal $I_C$, the peak reduction distortion is applied to each of the input signals $I_1$ and $I_2$ to provide corresponding preconditioned signals $I_1'$ and $I_2'$. Those portions in each of the preconditioned signals $I_1'$ and $I_2'$ that correspond to excessive portions in the combined signal $I_C$ are reduced by an amount in direct relation to the extent in which the excessive portions exceed a desired peak threshold, $P_{TH}$. FIGS. 2A and 2B illustrate this concept according to one embodiment of the present invention. Notably, the extent of reduction need not be direct, but may be scaled in a desired fashion.

With particular reference to FIG. 2A, power levels for the input signals $I_1$ and $I_2$ are shown in relation to the power level for a combined signal $I_C$, which was formed by summing the input signals $I_1$ and $I_2$. Power levels for each of the signals are normalized such that the peak threshold, $P_{TH}$, is about 5.4. The three portions of the combined signal $I_C$ that exceed the peak threshold $P_{TH}$ are highlighted in bold and are considered excessive portions. As will be described in greater detail, the peak reduction distortion to be applied to the input signals $I_1$ and $I_2$ may be generated based on the excessive portions that appear in the combined signal $I_C$. Once generated, the peak reduction distortion is applied to both of the input signals $I_1$ and $I_2$ to form the preconditioned signals $I_1'$ and $I_2'$.

As illustrated in FIG. 2B, those portions in each of the preconditioned signals $I_1'$ and $I_2'$ that correspond to the excessive portions in the combined signal $I_C$ have been reduced by an amount in direct relation to the extent in which the excessive portions in the combined signal $I_C$ exceed the peak threshold $P_{TH}$. Those portions of the preconditioned signals $I_1'$ and $I_2'$ that have been reduced in light of the application of the peak reduction distortion are highlighted in bold. The extent and nature of this reduction will generally correspond to the extent to which the excessive portions of the combined signal $I_C$ exceed the peak threshold $P_{TH}$; however, this reduction does not need to track the excessive portions as precisely as that illustrated. For example, filtering may be used during the process of generating the peak reduction distortion to reduce or remove high frequency components that would otherwise appear in the peak reduction distortion as a result of prior signal processing. Such reduction may result in a softening of those harder transitions within the preconditioned signals $I_1'$ and $I_2'$, especially at or near the boundaries of those portions of the preconditioned signals $I_1'$ and $I_2'$ that have been reduced.

The portions of the input signals $I_1$ and $I_2$ that are reduced by application of the peak reduction distortion are not necessarily tied to peaks within or any portions that exceed certain thresholds in the input signals $I_1$ and $I_2$. Notably, the amount of the reduction for those portions of the preconditioned signals $I_1'$ and $I_2'$ that have been reduced may be proportional to or scaled with respect to the extent to which corresponding portions of the combined signal $I_C$ exceed the peak threshold $P_{TH}$. In essence, application of the peak reduction distortion that is derived from the combined signal $I_C$ reduces the combined peak power associated with the preconditioned signals $I_1'$ and $I_2'$ with respect to the input signals $I_1$ and $I_2$. This reduction in combined peak power reduces the total peak power associated the preconditioned signals $I_1'$ and $I_2'$, and as will be seen below, reduces the amplification requirements of the communication device 10.

Returning to FIG. 1, once the PPR circuitry 16 generates the preconditioned signals $I_1'$ and $I_2'$, splitting circuitry 18 is configured to generate a number of split signals A, B, and C based on the preconditioned signals $I_1'$ and $I_2'$. Although three split signals are illustrated, any number may be used and will generally correspond to the number of up-conversion and amplification paths that are provided in the transmission path. Each split signal A, B, and C is a function of each of the preconditioned signals $I_1'$ and $I_2'$, and as such, may have components of all of the preconditioned signals $I_1'$ and $I_2'$. The split signals A, B, and C may be represented as follows:

$A = f_{s1}(I_1', I_2')$;
$B = f_{s2}(I_1', I_2')$; and
$C = f_{s3}(I_1', I_2')$, wherein $f_{s2}(x)$, $f_{s2}(x)$, and $f_{s3}(x)$ are splitting functions and may be the same or different functions.

In this example, the splitting function 18 will generate the split signals A, B, and C based on how the preconditioned signals $I_1'$ and $I_2'$ are generated. The nature in which the input signals $I_1$ and $I_2$ are combined impacts the location and extent of peaks, including excessive peaks, that appear in the preconditioned signals $I_1'$ and $I_2'$ in a known manner. The splitting functions $f_{sn}(x)$ are preferably configured in light of how the preconditioned signals $I_1'$ and $I_2'$ are combined such that the split signals A, B, and C are peak reduced signals, each of which is associated with a relatively low total peak power. Each split signal A, B, and C is up-converted to RF by corresponding RF up-conversion circuitry 20(A, B, and C) to provide up-converted signals $A_{RF}$, $B_{RF}$, and $C_{RF}$. The up-converted signals $A_{RF}$, $B_{RF}$, and $C_{RF}$ are amplified by corresponding power amplifiers 22(A, B, and C) along parallel amplification paths to provide a like number of amplified RF signals $g_a \cdot A_{RF}$, $g_b \cdot B_{RF}$, and $g_c \cdot C_{RF}$, wherein the power amplifiers 22(A, B, and C) are designed to provide respective gains $g_a$, $g_b$, and $g_c$. These gains $g_a$, $g_b$, and $g_c$ are intended to provide the necessary amplification required for transmission in light of the combining circuitry 24, which is described below. Given the relatively low total peak power associated with the split signals A, B, and C, and thus the corresponding up-converted signals $A_{RF}$, $B_{RF}$, and $C_{RF}$, the overall power amplification requirement is reduced, and thus allows the combination of power amplifiers 22(A, B, and C) to be designed to take advantage of the reduced power amplification requirement and operate in a very efficient manner relative to existing systems.

As indicated, the amplified RF signals ($g_a \cdot A_{RF}$, $g_b \cdot B_{RF}$, and $g_c \cdot C_{RF}$) are processed by the combining circuitry 24 to generate RF output signals $O_1$ and $O_2$ that directly correspond to each of the preconditioned signals $I_1'$ and $I_2'$ and generally represent up-converted and amplified versions of the preconditioned signals $I_1'$ and $I_2'$. The RF output signals $O_1$ and $O_2$ are functions of the amplified RF signals $g_a \cdot A_{RF}$, $g_b \cdot B_{RF}$, and $g_c \cdot C_{RF}$ and may be represented as follows:

$O_1 = f_{c1}(g_a \cdot A_{RF}, g_b \cdot B_{RF}, g_c \cdot C_{RF})$; and
$O_2 = f_{c2}(g_a \cdot A_{RF}, g_b \cdot B_{RF}, g_c \cdot C_{RF})$, wherein the combining functions $f_{c1}$ and $f_{c2}$ may be the same or different, but together are substantially complementary to the splitting functions $f_{s1}$, $f_{s2}$, and $f_{s3}$.

As indicated, the splitting circuitry 18 and the combining circuitry 24 provide related signal processing functions wherein the split signals A, B, and C are generated from the preconditioned signals $I_1'$ and $I_2'$ using splitting functions $f_{sn}(x)$, which are substantially complementary to the combining functions $f_{cn}(x)$ that are used to generate the RF output signals $O_1$ and $O_2$ from the amplified RF signals $g_a \cdot A_{RF}$, $g_b \cdot B_{RF}$, and $g_c \cdot C_{RF}$. Since the splitting functions $f_{sn}(x)$ may be related to the input combination function $f_{ic}(x)$ provided by the PPR circuitry 16, each of the splitting $f_{sn}(x)$, combining $f_{cn}(x)$, and input combination $f_{ic}(x)$ functions may all be interrelated.

Notably, the gains $g_a$, $g_b$, and $g_c$ provided by the power amplifiers 22(A, B, and C) may take into consideration any reduction in the number of signals to be provided by the combining circuitry 24. In this example, three amplified RF signals $g_a \cdot A_{RF}$, $g_b \cdot B_{RF}$, and $g_c \cdot C_{RF}$ are combined into two output signals $O_1$ and $O_2$. These gains $g_a$, $g_b$, and $g_c$ may be the same or different depending on splitting functions $f_{s1}(x)$ and combining functions $f_{c1}(x)$ provided by the splitting circuitry 18 and the combining circuitry 24, respectively. The RF output signals $O_1$ and $O_2$ are presented to corresponding antennas 26 for transmission. Notably, each of the RF output signals $O_1$ and $O_2$ may be provided to one or more corresponding antennas 26 for transmission.

The splitting circuitry 18 or other associated circuitry may employ pre-distortion techniques to pre-distort the split signals A, B, and C to address any non-linear processing characteristics that are injected along the up-conversion and amplification paths. The output signals $O_1$ and $O_2$ may be fed back to the splitting circuitry 18 and used to identify and address these non-linear processing characteristics. For further information related to parallel amplification circuitry and related processing, reference is made to the commonly assigned U.S. patent application Ser. No. 12/058,027, which is entitled, AMPLIFIER PRE-DISTORTION SYSTEMS AND METHODS, which was filed on Mar. 28, 2008, the disclosure of which is incorporated herein by reference.

Figure 3:
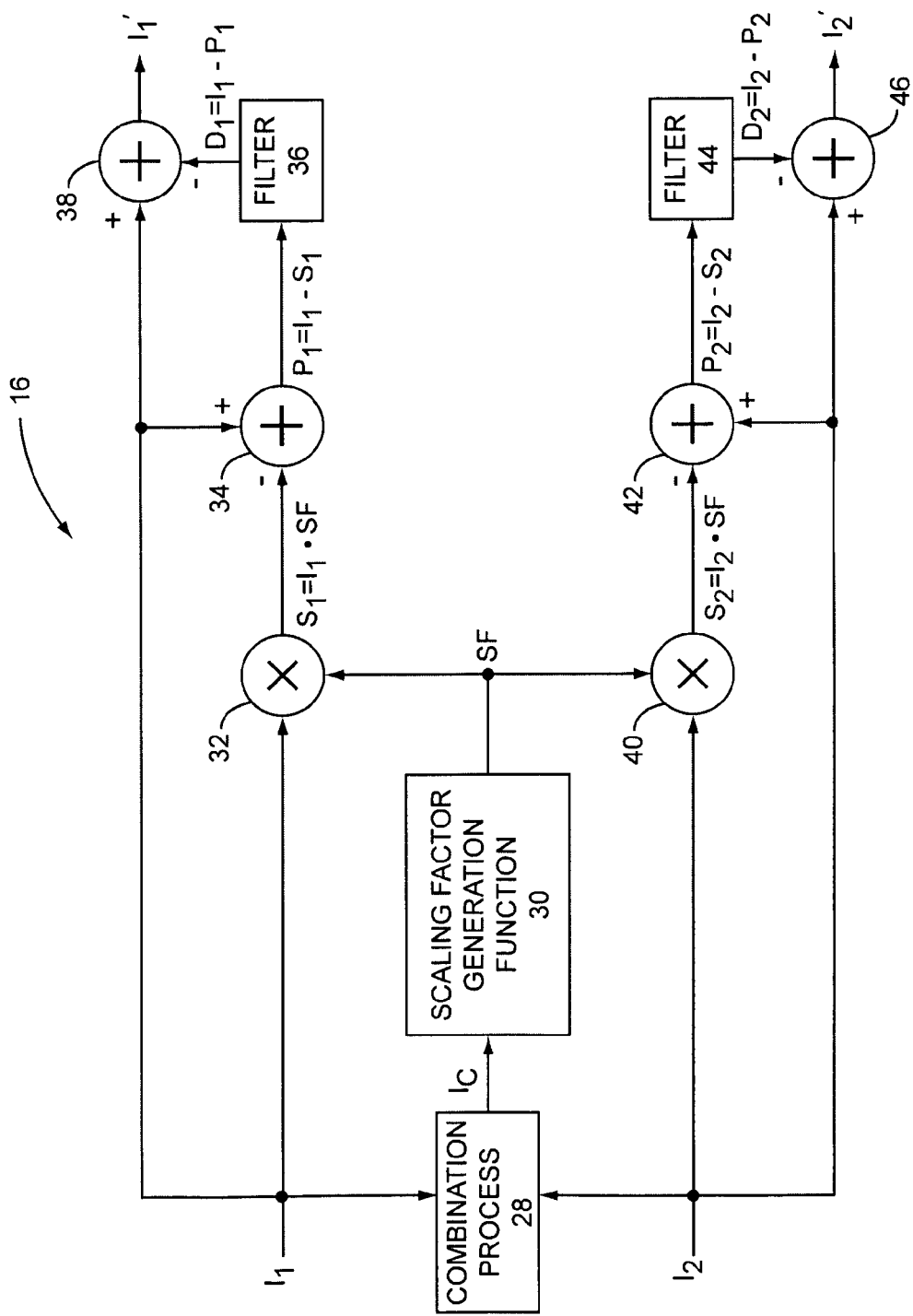
FIG. 3 is a block representation of peak power reduction circuitry according to one embodiment of the present invention.

With reference to FIG. 3, a functional block diagram of exemplary PPR circuitry 16 is provided according to one embodiment. This embodiment reduces the peak power of two input signals $I_1$ and $I_2$ using peak reduction distortion that is derived from a combined signal $I_C$ using a particular process. Notably, the present invention is not limited to this example and those skilled in the art will recognize other techniques for the generating peak reduction distortion based on the combined signal $I_C$.

Initially, the input signals $I_1$ and $I_2$ are combined according to an input combination function $f_{ic}(x)$ to form the combined signal $I_C$ by a combination process 28. Although the input combination function $f_{ic}(x)$ may employ weighting factors or phase shifts to any or all of the input signals $I_1$ and $I_2$, the example herein assumes the input signals are added together without weighting or application of a phase shift. As such, $f_{ic}(x) = I_1 + I_2$. Notably, the combined signal $I_C$ may represent a single combination or multiple combinations of the input signals $I_1$ and $I_2$, such as $f_{ic1}(x) = I_1 + I_2$. and $f_{ic2}(x) = I_1 - I_2$. The output of the combination process 28 is provided to the scaling generation function 30 as one or more signals, which represent the combined signal $I_C$.

The combined signal $I_C$ is used by a scaling factor generation function 30 to generate scaling factors SF in relation to an amount in which the peaks of the combined signal $I_C$ exceed a given peak threshold $P_{TH}$. For portions of the combined signal $I_C$ that exceed the peak threshold $P_{TH}$, the scaling factors SF are essentially used to reduce corresponding portions of the input signals $I_1$ and $I_2$ in relation to the extent the combined signal $I_C$ exceeds the peak threshold $P_{TH}$. The scaling factors SF for those portions of the combined signal $I_C$ that do not exceed the peak threshold $P_{TH}$ may be relatively fixed, and in this example are unity (SF=1). Exemplary scaling factors SF are graphically illustrated in FIG. 4 with respect to a signal peak in the combined signal $I_C$. This peak exceeds the peak threshold $P_{TH}$ (of 4) between about time t=0.5 and 3.5 and is less than the peak threshold $P_{TH}$ before about time t=0.5 and after about time t=3.5. Assume scaling factors SF(t) are determined for times t=0, 1, 2, 3, and 4 and are calculated as follows:

If $I_{C(t)} \leq P_{TH}$, then $SF(t)=1$; and

If $I_{C(t)} > P_{TH}$, then $SF(t) = P_{TH}/I_{C(t)}$, wherein $I_{C(t)}$ is the magnitude of the combined signal $I_C$ at time $t$.

Figure 4:
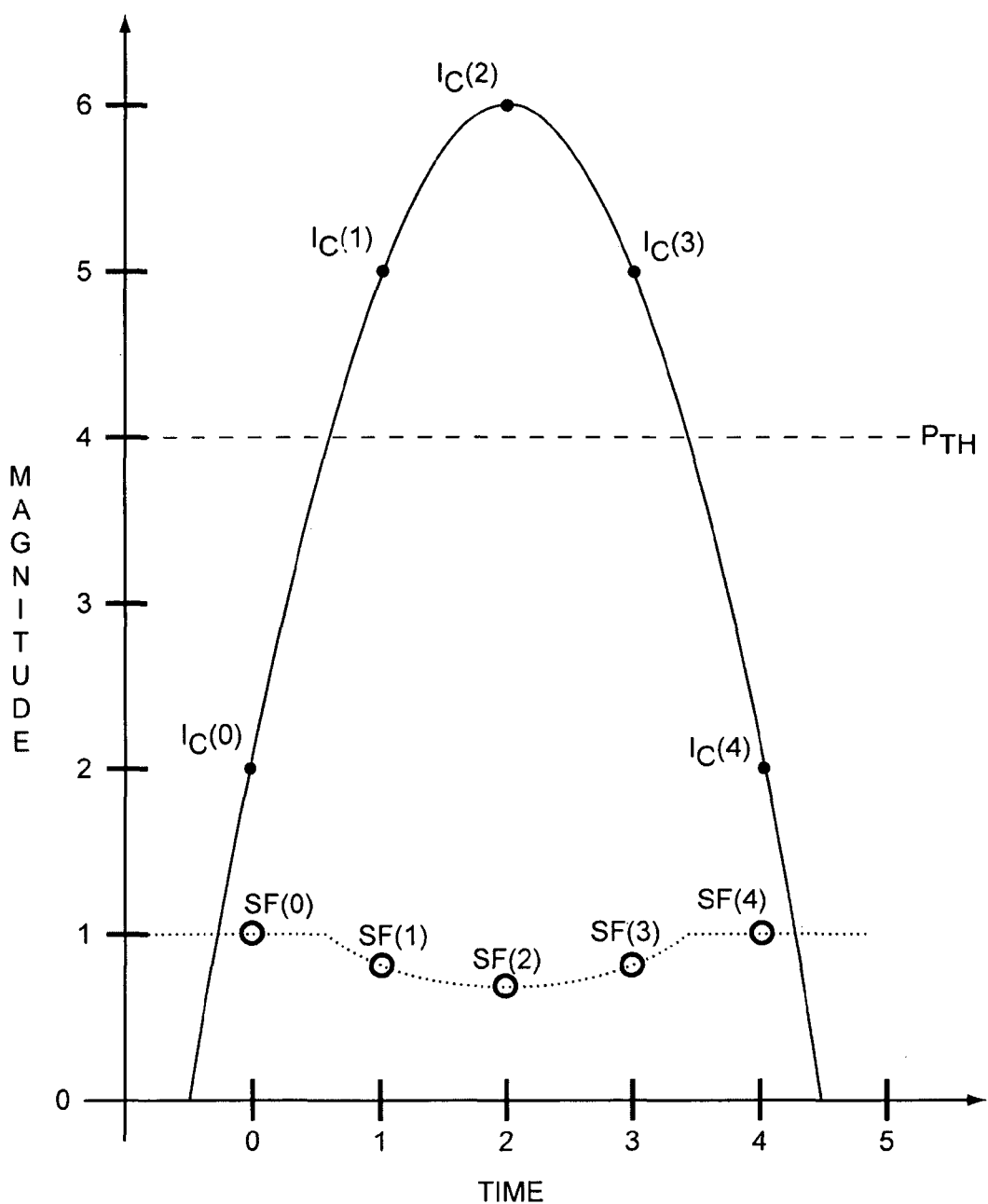
FIG. 4 illustrates exemplary scaling factors for a combined signal that has a peak exceeding a peak threshold.

For the illustrated example of FIG. 4, the scaling factors SF(t) for t=0, 1, 2, 3, and 4 are as follows:

$SF(0)=1$;

$SF(1)=P_{TH}/I_{C(1)}=4/5=0.8$;

$SF(2)=P_{TH}/I_{C(2)}=4/6=-0.67$;

$SF(3)=P_{TH}/I_{C(3)}=4/5=0.8$; and $SF(4)=1$.

These scaling factors SF may then be effectively applied to each of the input signals $I_1$ and $I_2$ as follows in a time aligned fashion, wherein the scaling factor SF(t) is applied to each of the input signals $I_1(t)$ and $I_2(t)$ at time t. Although delay functions are not illustrated, it is preferable to ensure that the signal processing provided by the PPR circuitry 16 is provided in time aligned manner. For the input signal $I_1$, the scaling factor SF is applied to the input signal $I_1$ in a time aligned manner via a multiplication function 32 to provide a scaled signal $S_1$, wherein $S_1 = I_1 \cdot SF$. Further, the scaling factors SF need not be proportional, or equal, to the extent to which the corresponding portions of the combined signal $I_C$ exceed the peak threshold $P_{TH}$.

Those portions of the scaled signal $S_1$ that correspond to portions in the combined signal $I_C$ that exceed the peak threshold $P_{TH}$ will be reduced in relation to the corresponding scaling factor SF. In this example, those portions of the scaled signal $S_1$ that correspond to portions in the combined signal $I_C$ that do not exceed the peak threshold $P_{TH}$ are for the most part not affected. Those skilled in the art will recognize that transitional scaling may be applied to effectively smooth the transition between those portions of the input signal $I_1$ that correspond to portions of the combined signal $I_C$ that exceed the peak threshold $P_{TH}$ and those that do not. Further, the scaling factors may be generated from a single combination of the input signals $I_1$ and $I_2$ or from multiple combinations of the input signals $I_1$ and $I_2$. For example, intermediate scaling factors may be generated for each of the multiple combinations, and the intermediate scaling factors may be combined, through multiplication or the like, to form the overall scaling factor SF, which is applied to the input signal $I_1$ in a time aligned manner via the multiplication function 32 to provide the scaled signal $S_1$. When the combined input signal $I_C$ comprises multiple signals, each of the multiple signals may be associated with the same or different peak thresholds.

Once generated, the scaled signal $S_1$ is subtracted from the input signal $I_1$ in a time aligned manner at a summing function 34 to generate a peaks signal $P_1$, wherein $P_1 = I_1 - S_1 = I_1 - (I_1 \cdot SF)$. The peaks signal $P_1$ represents the signal that will be used to distort the input signal $I_1$ along with any other noise or transients caused by the previous processing. The peaks signal $P_1$ is filtered by a filter 36 to remove any undesirable noise and transients to generate a distortion signal $D_1$, which is subtracted from the input signal $I_1$ at a summing function 38 to generate the preconditioned signal $I_1'$. In this embodiment, the distortion signal $D_1$ represents the peak reduction distortion that is applied to the input signal $I_1$ to generate the preconditioned signal $I_1'$. The filter 36 may be a low pass filter that is used to reduce or remove high frequency components that would otherwise appear in the distortion signal $D_1$, and ultimately the preconditioned signal $I_1'$ as a result of the prior processing. Such reduction may result in a softening of those harder transitions within the preconditioned signal $I_1'$ especially at or near the boundaries of those portions of preconditioned signals $I_1'$ that correspond to portions in the input signal $I_1$ that have been reduced. The degree of filtering will correspond to the extent in which those harder transitions are softened. As with the input signal $I_1$, the scaling factor SF is applied to the input signal $I_2$ in a time aligned manner via a multiplication function 40 to provide a scaled signal $S_2$, wherein $S_2=I_2 \cdot SF$. Those portions of the scaled signal $S_2$ that correspond to portions in the combined signal $I_C$ that exceed the peak threshold $P_{TH}$ will be reduced in light of the corresponding scaling factor SF. Again, those portions of the scaled signal $S_2$ that correspond to portions in the combined signal $I_C$ that do not exceed the peak threshold $P_{TH}$ are for the most part not affected. Transitional scaling may be applied to effectively smooth the transition between those portions of the input signal $I_2$ that correspond to portions of the combined signal $I_C$ that exceed the peak threshold $P_{TH}$ and those that do not.

The scaled signal $S_2$ is then subtracted from the input signal $I_2$ in a time aligned manner at a summing function 42 to generate a peaks signal $P_2$, wherein $P_2=I_2-S_2=I_2-(I_2 \cdot SF)$). The peaks signal $P_2$ is filtered by a filter 44 to remove any undesirable noise and transients to generate a corresponding distortion signal $D_2$, which is subtracted from the input signal $I_2$ at a summing function 46 to generate the preconditioned signal $I_2$'. The distortion signal $D_2$ represents the peak reduction distortion that is applied to the input signal $I_2$ to generate the preconditioned signal $I_2$'.

The resulting preconditioned signals $I_1$' and $I_2$' are then passed to the splitting circuitry 18 for processing as described above. As indicated, any number of input signals $I_X$ may be processed in this fashion, wherein peak reduction distortion is generated based on the combination of these input signals $I_x$ and is applied to each of the input signals $I_x$ individually.

The present invention is applicable to virtually any communication system wherein input signals are being transmitted at the same time via corresponding antennas 26. The invention is applicable in communication systems that simultaneously support code division multiple access (CDMA), OFDM, TDMA schemes, or any combination thereof. Further, application of existing PAPR techniques may be provided on one or more of the input signals $I_x$ prior to application of one or more of the concepts of the previously described concepts.

Figure 5:
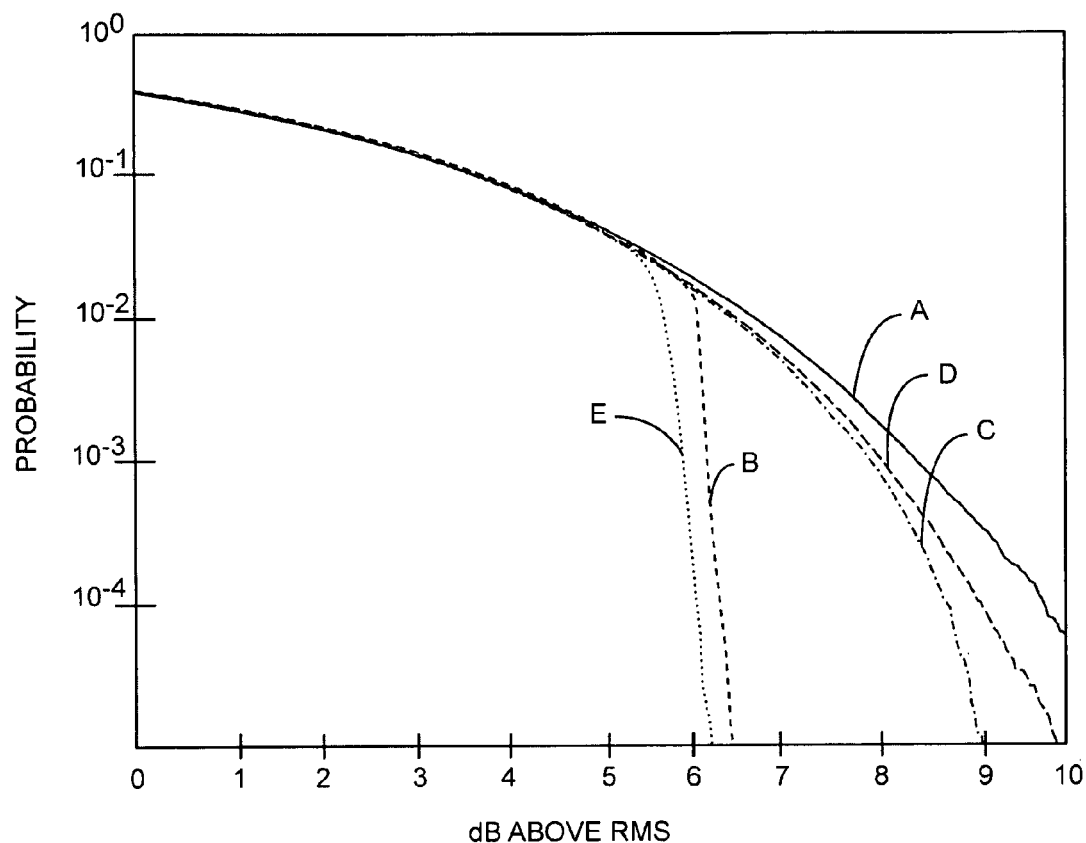
FIG. 5 illustrates peak-to-average power ratios (PAPRs) for various signals.

With reference to FIG. 5, a graph is presented to illustrate the probability of a particular signal having peaks above a defined root mean square (RMS) power level for OFDMA/LTE signals. The five curves that are plotted on the graph represent the probability that peak power levels above the RMS power level will occur for different signals. Curve A represents the PAPR associated with either of the input signals $I_1$ or $I_2$ for which peak power reduction has not been provided. Curve B represents the PAPR associated with either of the input signals $I_1$ or $I_2$ for which peak power reduction has been individually applied. Notably, the PAPR for either of the input signals $I_1$ or $I_2$ for which peak power reduction has been provided is significantly lower than that associated with either of the input signals $I_1$ or $I_2$ for which peak power reduction has not been provided. Curve C represents the PAPR associated with the combination of peak power reduced input signals $I_1$ and $I_2$ for which peak power reduction was individually applied. Notably, the PAPR for the combination of the individually peak power reduced input signals is significantly greater than the PAPR for either one of the individually peak power reduced input signals $I_1$ or $I_2$. As illustrated, combining signals that have been individually peak power reduced often negates the benefits of employing peak power reduction.

Curve D represents the PAPR associated with either of the preconditioned signals $I_1$' and $I_2$', which have been subjected to the peak power distortion derived from the combined signal $I_C$ according to the concepts of the present invention. The PAPR associated with the combination of the preconditioned signals $I_1$' and $I_2$' is represented by the PAPR of the combined signal $I_C$, which is provided by curve E. While the PAPR for either of the preconditioned signals $I_1$' and $I_2$' appears relatively high in isolation, the PAPR for the combination of the preconditioned signals is the lowest of the all of the curves. Accordingly, the present invention is capable of providing combined signals that have significantly improved PAPRs with respect to that provided by the prior art.

The baseband circuitry 12, modulation function 14, PPR circuitry 16, splitting circuitry 18, and RF up-conversion circuitry 20 may be provided in one or more processors or appropriate application specific integrated circuits. The combining circuitry 24 may be provided by one more combiners that are configured to provide a complementary function with respect to that provided by the splitting circuitry 18.

Those skilled in the art will recognize improvements and modifications to the embodiments of the present invention. All such improvements and modifications are considered within the scope of the concepts disclosed herein and the claims that follow.

What is claimed is:

1. A method comprising:
   receiving a plurality of input signals, each of which being a modulated communication signal;
   combining each of the plurality of input signals to provide a combined signal;
   generating peak reduction distortion based on the combined signal, wherein generating the peak reduction distortion comprises:
      identifying excessive portions of the combined signal that exceed a peak threshold; and
      generating a distortion signal in relation to an extent to which the excessive portions of the combined signal exceed the peak threshold; and
   applying the peak reduction distortion to the each of the plurality of input signals to provide a plurality of preconditioned signals, wherein applying the peak reduction distortion comprises applying the distortion signal to each of the plurality of input signals such that first portions of each of the plurality of input signals that correspond to the excessive portions of the combined signal are reduced in relation to the extent to which the excessive portions of the combined signal exceed the peak threshold.

2. The method of claim 1 wherein generating the distortion signal comprises generating first scaling factors for the excessive portions in relation to the extent to which the excessive portions exceed the peak threshold and generating the distortion signal for the first portions of each of the plurality of input signals based on the first scaling factors.

3. The method of claim 2 wherein:
   generating the distortion signal further comprises generating a relatively fixed scaling factor for those portions of the combined signal that do not exceed the peak threshold and generating the distortion signal for second portions of each of the plurality of input signals that correspond to the portions of the combined signal that do not exceed the peak threshold based on the relatively fixed scaling factor; and
   applying the peak reduction distortion further comprises applying the distortion signal to each of the plurality of input signals such that the second portions of each of the plurality of input signals are scaled by the relatively fixed scaling factor.

4. The method of claim 2 wherein generating the distortion signal for the first portions of each input signal of the plurality of input signals comprises:

generating the first scaling factors for the excessive portions in relation to the extent to which the excessive portions exceed the peak threshold;
multiplying the input signal by the first scaling factors to generate a scaled signal; and
subtracting the scaled signal from the input signal to generate a peaks signal, wherein applying the distortion signal comprises subtracting the peaks signal from the input signal.

5. The method of claim 4 wherein the peaks signal is filtered prior to being subtracted from the input signal.

6. The method of claim 1 wherein a first signal of the plurality of input signals is modulated according to a common modulation scheme, wherein the common modulation scheme is one of frequency division multiple access (FDMA), orthogonal frequency division multiple access (OFDMA), code division multiple access (CDMA), and time division multiple access (TDMA) schemes.

7. The method of claim 6 wherein the common modulation scheme is one of frequency division multiple access (FDMA), orthogonal frequency division multiple access (OFDMA), code division multiple access (CDMA), and time division multiple access (TDMA) schemes.

8. The method of claim 6 wherein the input signals are modulated to employ a diversity scheme such that different data is mapped to different ones of the input signals at the same time or common data is mapped to the different signals at the same time.

9. The method of claim 6 wherein the common modulation scheme is an orthogonal frequency division multiple access (OFDMA) scheme.

10. The method of claim 1 further comprising:
generating a plurality of split signals that are first functions of each of the plurality of preconditioned signals;
up-converting and amplifying each of the plurality of split signals individually to provide a plurality of radio frequency signals; and
generating a plurality of output signals that are second functions of each of the plurality of radio frequency signals, wherein the second functions are complementary to the first functions.

11. The method of claim 10 wherein the first functions are identical to one another and the second functions are identical to one another.

12. The method of claim 10 further comprising generating amplified radio frequency signals based on the plurality of preconditioned signals and transmitting each of the plurality of radio frequency signals simultaneously via a corresponding one of a plurality of antennas.

13. The method of claim 10 wherein each of the plurality of input signals are combined such that each of the plurality of split signals are generated using the first functions are peak reduced signals.

14. A transceiver path in a communication system comprising:
peak power reduction (PPR) circuitry adapted to:
receive a plurality of input signals, each of which being a modulated communication signal;
combine each of the input signals to provide a combined signal;
generate peak reduction distortion based on the combined signal, wherein to generate the peak reduction distortion, the PPR circuitry is further adapted to:
identify excessive portions of the combined signal that exceed a peak threshold; and
generate a distortion signal in relation to an extent to which the excessive portions of the combined signal exceed the peak threshold; and
apply the peak reduction distortion to the each of the plurality of input signals to provide a plurality of preconditioned signals, wherein to apply the peak reduction distortion, the PPR circuitry is further adapted to apply the distortion signal to each of the plurality of input signals such that first portions of each of the plurality of input signals that correspond to the excessive portions of the combined signals are reduced in relation to the extent to which the excessive portions of the combined signal exceed the peak threshold;
splitting circuitry adapted to generate a plurality of split signals that are first functions of each of the plurality of preconditioned signals;
a plurality of parallel paths in which each of the plurality of split signals are up-converted by up-conversion circuitry and amplified by a power amplifier to provide a corresponding plurality of radio frequency signals; and
combining circuitry adapted to generate a plurality of output signals that are second functions of each of the plurality of radio frequency signals, wherein the second functions are complementary to the first functions.

15. The transceiver path of claim 14 wherein to generate the distortion signal, the PPR circuitry is further adapted to generate first scaling factors for the excessive portions in relation to the extent to which the excessive portions exceed the peak threshold, and generate the distortion signal for the first portions of each of the plurality of input signals based on the first scaling factors.

16. The transceiver path of claim 15 wherein:
to generate the distortion signal, the PPR circuitry is further adapted to generate a relatively fixed scaling factor for those portions of the combined signal that do not exceed the peak threshold and generate the distortion signal for second portions of each of the plurality of input signals that correspond to the portions of the combined signal that do not exceed the peak threshold based on the relatively fixed scaling factor; and
to apply the peak reduction distortion, the PPR circuitry is further adapted to apply the distortion signal to each of the plurality of input signals such that the second portions of each of the plurality of input signals are scaled by the relatively fixed scaling factor.

17. The transceiver path of claim 15 wherein to generate the distortion signal for the first portions of each input signal of the plurality of input signals, the PPR circuitry is further adapted to:
generate the first scaling factors for the excessive portions in relation to the extent to which the excessive portions exceed the peak threshold;
multiply the input signal by the first scaling factors to generate a scaled signal; and
subtract the scaled signal from the input signal to generate a peaks signal, wherein applying the distortion signal comprises subtracting the peaks signal from the input signal.

18. The transceiver path of claim 17 wherein the peaks signal is filtered by a filter prior to being subtracted from the input signal.

19. The transceiver path of claim 14 wherein a first signal of the plurality of input signals is modulated according to a common modulation scheme, wherein the common modulation scheme is one of frequency division multiple access (FDMA), orthogonal frequency division multiple access (OFDMA), code division multiple access (CDMA), and time division multiple access (TDMA) schemes.

20. The method of claim 19 wherein the common modulation scheme is one of frequency division multiple access (FDMA), orthogonal frequency division multiple access (OFDMA), code division multiple access (CDMA), and time division multiple access (TDMA) schemes.

21. The transceiver path of claim 19 wherein the input signal are modulated to employ a diversity scheme such that different data is mapped to different ones of the input signals at the same time or common data is mapped to the different signals at the same time.

22. The transceiver path of claim 19 wherein the common modulation scheme is an orthogonal frequency division multiple access (OFDMA) scheme.

23. The transceiver path of claim 14 wherein the first functions are identical to one another and the second functions are identical to one another.

24. The transceiver path of claim 14 wherein each of the plurality of input signals are combined such that each of the plurality of split signals generated using the first functions are peak reduced signals.

25. The transceiver path of claim 14 wherein each of the plurality of radio frequency signals is transmitted simultaneously via a corresponding one of a plurality of antennas.

* * * * *